(12) United States Patent
Vinegrad et al.

(10) Patent No.: US 11,835,769 B2
(45) Date of Patent: Dec. 5, 2023

(54) ADJUSTABLE ATTENUATION OPTICAL UNIT

(71) Applicant: Applied Materials Israel Ltd., Rehovot (IL)

(72) Inventors: Eitam Yitzchak Vinegrad, Rehovot (IL); Itay Asulin, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 129 days.

(21) Appl. No.: 17/404,900

(22) Filed: Aug. 17, 2021

(65) Prior Publication Data
US 2023/0055035 A1   Feb. 23, 2023

(51) Int. Cl.
*G02B 6/35* (2006.01)
*H01J 37/244* (2006.01)
*H01J 37/304* (2006.01)

(52) U.S. Cl.
CPC .......... *G02B 6/3538* (2013.01); *H01J 37/244* (2013.01); *H01J 37/3045* (2013.01); *H01J 2237/28* (2013.01)

(58) Field of Classification Search
CPC .. G02B 6/3538; H01J 37/244; H01J 37/3045; H01J 2237/28
See application file for complete search history.

(56) References Cited

U.S. PATENT DOCUMENTS

| | | | | |
|---|---|---|---|---|
| 5,015,057 A * | 5/1991 | Rumbaugh | ........... | G02F 1/1334 349/1 |
| 5,825,448 A * | 10/1998 | Bos | ........... | G02F 1/1396 349/128 |
| 6,621,952 B1 * | 9/2003 | Pi | ........... | G02B 6/29355 385/39 |
| 6,625,378 B2 * | 9/2003 | O'Brien | ........... | G02B 6/266 385/32 |
| 6,670,610 B2 | 12/2003 | Shemesh et al. | | |
| 6,867,888 B2 * | 3/2005 | Sutherland | ........... | G03H 1/02 430/1 |
| 6,895,161 B2 * | 5/2005 | Romo | ........... | G02B 6/3508 385/140 |
| 7,068,405 B2 * | 6/2006 | Sutherland | ........... | G03H 1/02 349/201 |
| 7,630,022 B1 * | 12/2009 | Baur | ........... | G02B 5/3083 349/96 |
| 8,709,269 B2 * | 4/2014 | Shemesh | ........... | G01N 1/32 250/492.1 |
| 2001/0046363 A1 * | 11/2001 | Purchase | ........... | G02F 1/065 385/140 |
| 2004/0239907 A1 * | 12/2004 | Hintersteiner | ........... | G03F 7/70558 355/67 |
| 2005/0099662 A1 * | 5/2005 | Sutherland | ........... | G02F 1/1326 359/15 |
| 2006/0114564 A1 * | 6/2006 | Sutherland | ........... | G02F 1/1326 359/489.08 |
| 2006/0119916 A1 * | 6/2006 | Sutherland | ........... | G02F 1/13342 359/34 |

* cited by examiner

*Primary Examiner* — David A Vanore
(74) *Attorney, Agent, or Firm* — Kilpatrick Townsend & Stockton LLP

(57) ABSTRACT

An adjustable attenuation optical unit that may include a lightguide that includes a core, wherein the core comprises an output, an input and an exterior surface; and an adjustable attenuator that is configured to define an interfacing parameter related to an area of the exterior surface thereby receiving at least some of the light that impinges on the area.

13 Claims, 8 Drawing Sheets

ADJUSTABLE ATTENUATION OPTICAL UNIT

BACKGROUND OF THE INVENTION

A scanning electron microscope (SEM) is required to evaluate a sample by illuminating the sample by an illuminating electron beam. The intensity of the illuminating electron beam may be selected from a large range of values.

Electrons that are scattered or reflected from the sample (due to the illumination) are collected, converted to light that propagates through a lightguide and then impinge on a photomultiplier tube (PMT).

The PMT has a limited linear response range that is smaller than the intensity range of light that may impinge on the PMT.

There is a growing need to limit the intensity of light that impinges on the PMT to the linear response range of the PMT, and especially to perform such limitation without excessive reducing the throughput of the SEM.

BRIEF SUMMARY OF THE INVENTION

There may be provided an adjustable attenuation optical unit and a method for adjustably attenuating light directed towards a PMT.

There may be provided an adjustable attenuation optical unit that may include a lightguide that comprises a core, wherein the core may include an output, an input, and an exterior surface; and an adjustable attenuator that is configured to define an interfacing parameter related to an area of the exterior surface thereby receiving at least some of a light that impinges on the area.

There may be provided a method for setting an adjustable attenuation optical unit, the method may include setting a value of an interfacing parameter related to the adjustable attenuation optical unit; wherein the adjustable attenuation optical unit comprises a lightguide and an adjustable attenuator; wherein the lightguide comprises a core, wherein the core comprises an output, an input and an exterior surface; and wherein the adjustable attenuator is configured to define an interfacing parameter related to an area of the exterior surface thereby receiving at least some of a light that impinges on the area; and propagating light through the adjustable attenuation optical unit while subjecting the light to the interfacing parameter.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
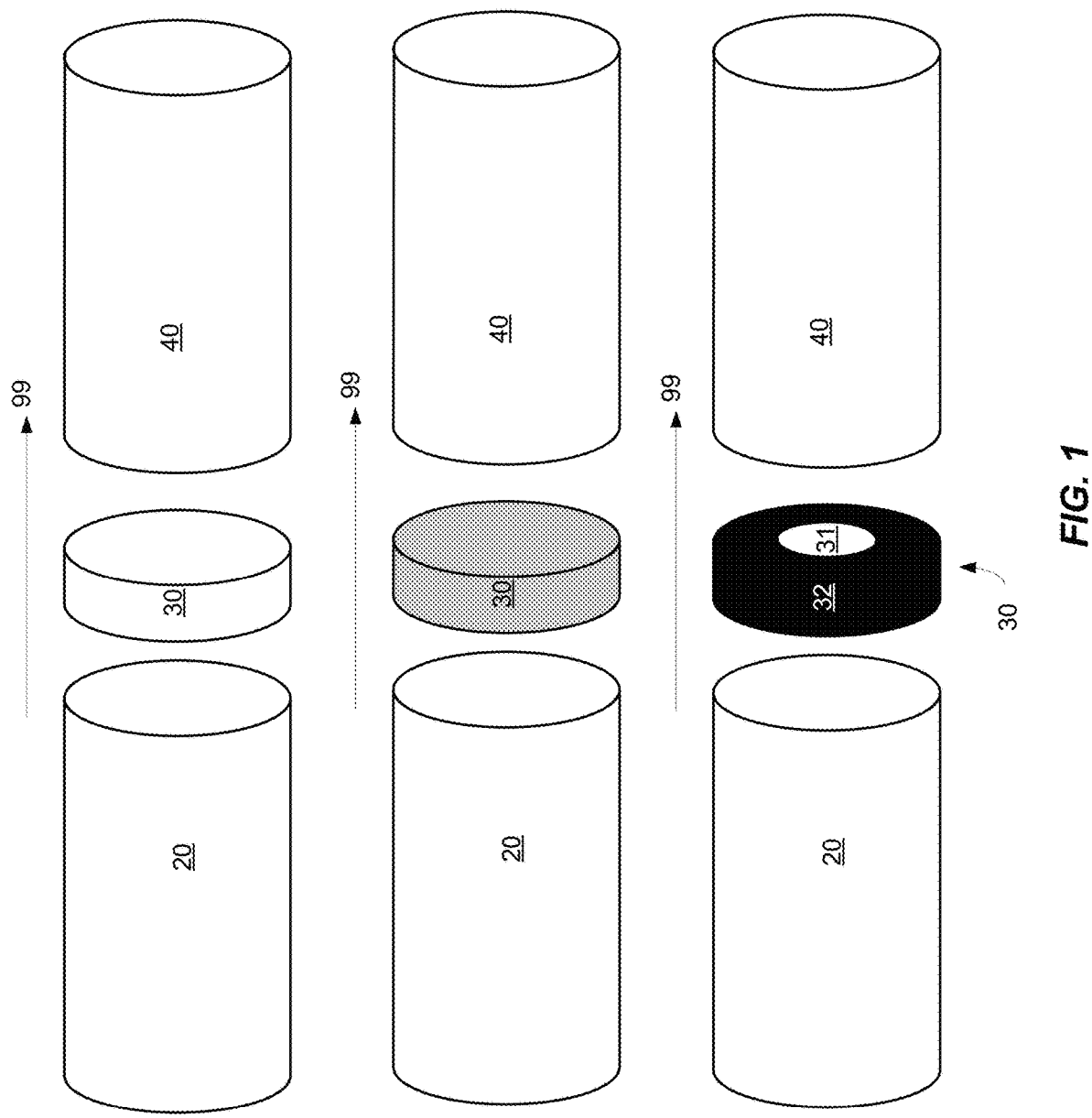
FIG. 1 is an example of an adjustable attenuation optical unit and its environment.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

Any reference to an electron should be applied mutatis mutandis to an ion.

There may be provided an adjustable attenuation optical unit and a method for adjustably attenuating light directed towards a PMT.

The method and adjustable attenuation optical unit may be used to limit the intensity of light that reaches the PMT to have values that correspond to the linear response range of the PMT. The method and the unit may provide maximal transmission (minimal attenuation) when maximal sensitivity is required and may increase the attenuation in cases where the light that enters the lightguide has an intensity that exceeds an upper intensity threshold. The method and the unit may improve the stability of the signal outputted by the PMT, and may be set to provide stable gain over time.

The method and system control the input to the PMT and improve system stability and channel gain.

The method and system lower thermal changes and reduce gain changes of the PMT—and reduce transient effects.

The method and the adjustable attenuation optical unit may allow a scanning electron microscope (SEM) or any other inspection, review or metrology electron based system to operate at a high throughput.

The transmission of the adjustable attenuation optical may be calculated in various manners, for example, may be calculated by multiplying the strength of the illuminating electron beam, the electron yield and the intensity of the collected electrons. The yield may be a function of the sample, the type of collected electrons (for example secondary or backscattered), and the like.

The transmission may be set to exceed a predefined value. The adjustable attenuation optical unit may be configured to comply with the required transmission function value.

FIG. 1 illustrates a lightguide 20, an adjustable attenuator 30 and a PMT 40. The adjustable attenuator 30 is positioned between the lightguide 20 and the PMT. FIG. 1 illustrates (from to top bottom):

An adjustable attenuator 30 at a no attenuation state in which light that exits the lightguide may propagate uninterrupted towards the PMT 40.

An adjustable attenuator 30 at an attenuation state in which the transparency of the adjustable attenuator changes to attenuate light that travels from the lightguide 20 to the PMT.

An adjustable attenuator 30 at an attenuation state in which a transparent aperture 31 is defined by the adjustable attenuator 30—and light that passes through the aperture may travel from the lightguide 20 to the PMT. Light outside the aperture is blocked by a blocking part 32 of the adjustable attenuator 30.

The adjustable attenuator may include a liquid crystal (LC) glass, a suspected particle device (SPD) glass, an SPD smart glass, electrochromic glass, thermochromic glass, photochromic glass, and the like.

It should be noted that the adjustable attenuator 30 may apply a combination of a blocking area and transparency change. For example, the transparent aperture 31 may be of any transparency level, and the like.

The overall direction of propagation signals is denoted 99.

FIGS. 2-5 illustrate a lightguide 20, a PMT 40 and an adjustable attenuator (30 or 32) that is not located between the PMT 40 and the lightguide 20. In this configuration the adjustable attenuator 30 does not affect the light passage when it is at a non-attenuating state.

Without the presence of the adjustable attenuator the light may propagate within the lightguide at a total internal reflection (TIR) mode.

In FIGS. 2-5 lightguide includes a core that includes input 22, output 23 and an exterior surface 24. The adjustable attenuator (31, 33) is configured to define an interfacing parameter related to an area of the exterior surface thereby receiving at least some of the light that impinges on the area.

The interfacing parameter may be the refraction index of a portion of the adjustable attenuator that contacts an area of the core, may be a critical angle of light at border formed between the area of the core and the adjustable attenuator.

Figure 3:
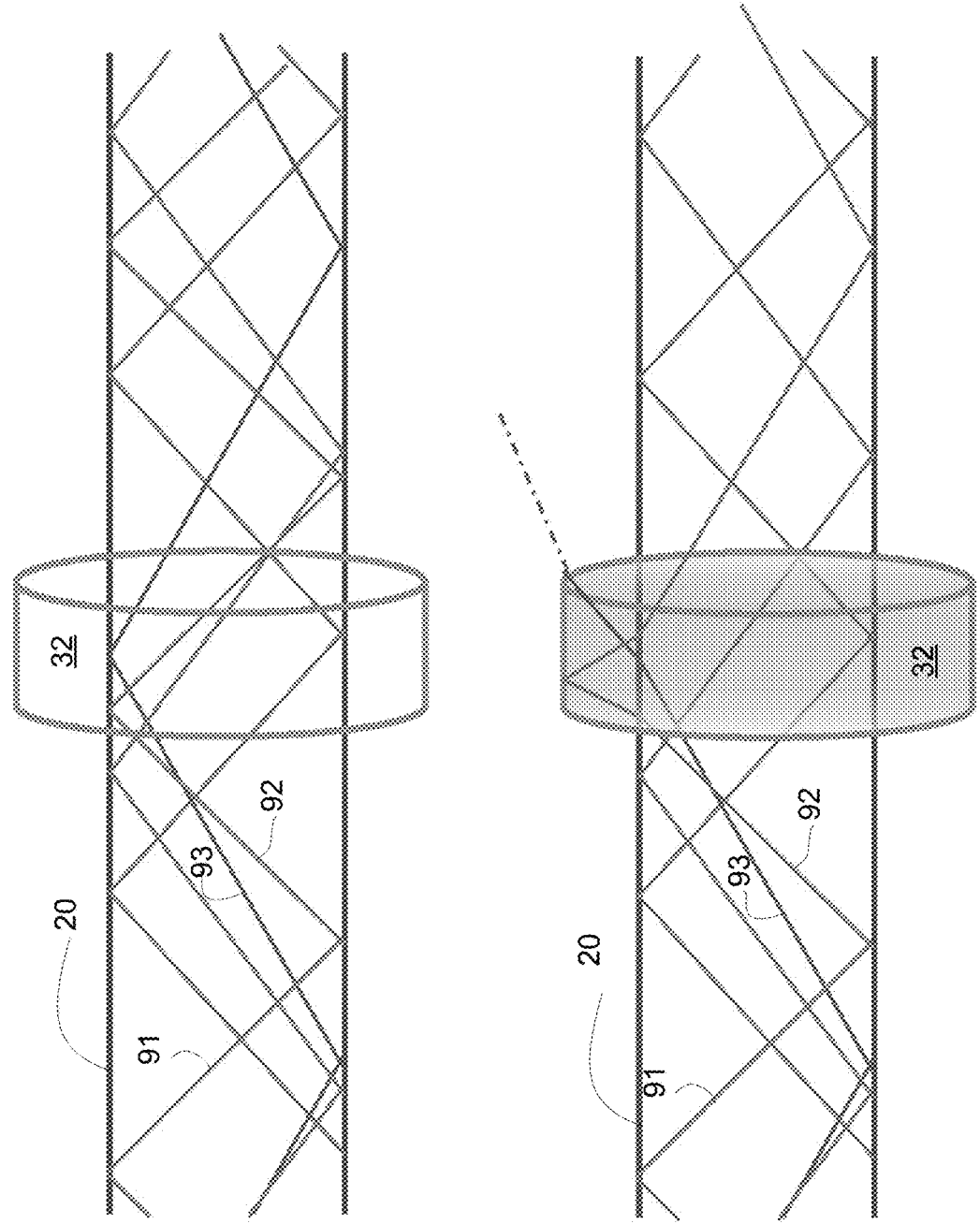
FIG. 3 is an example of a propagation of light within a core.
Figure 5:
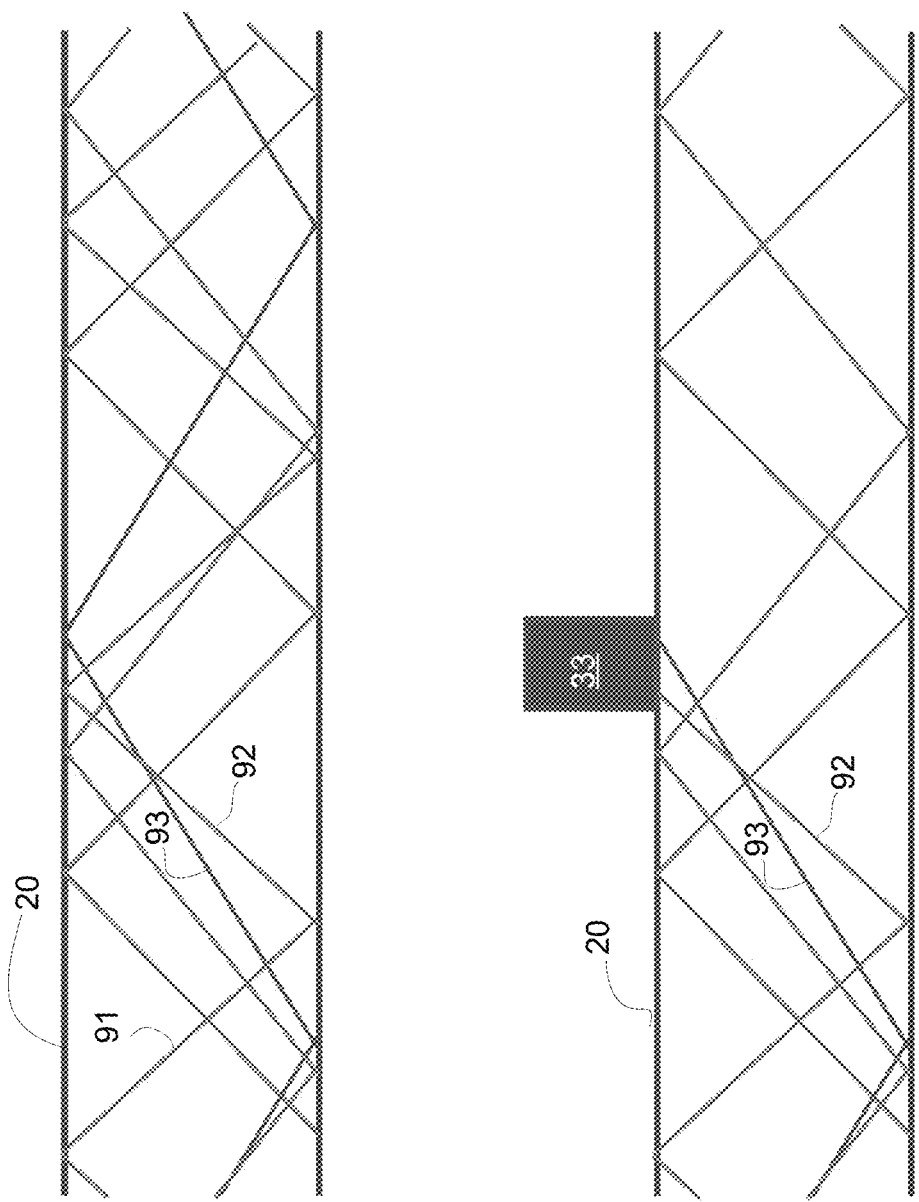
FIG. 5 is an example of a propagation of light within a core.

The interfacing element may be set so that light that impinges on the area of the core may exit the lightguide, and once exited the light may be further attenuated before returning to the lightguide (see light 92 of FIG. 3) or may not return to the lightguide (see light 93 of FIGS. 3 and 5).

Figure 2:
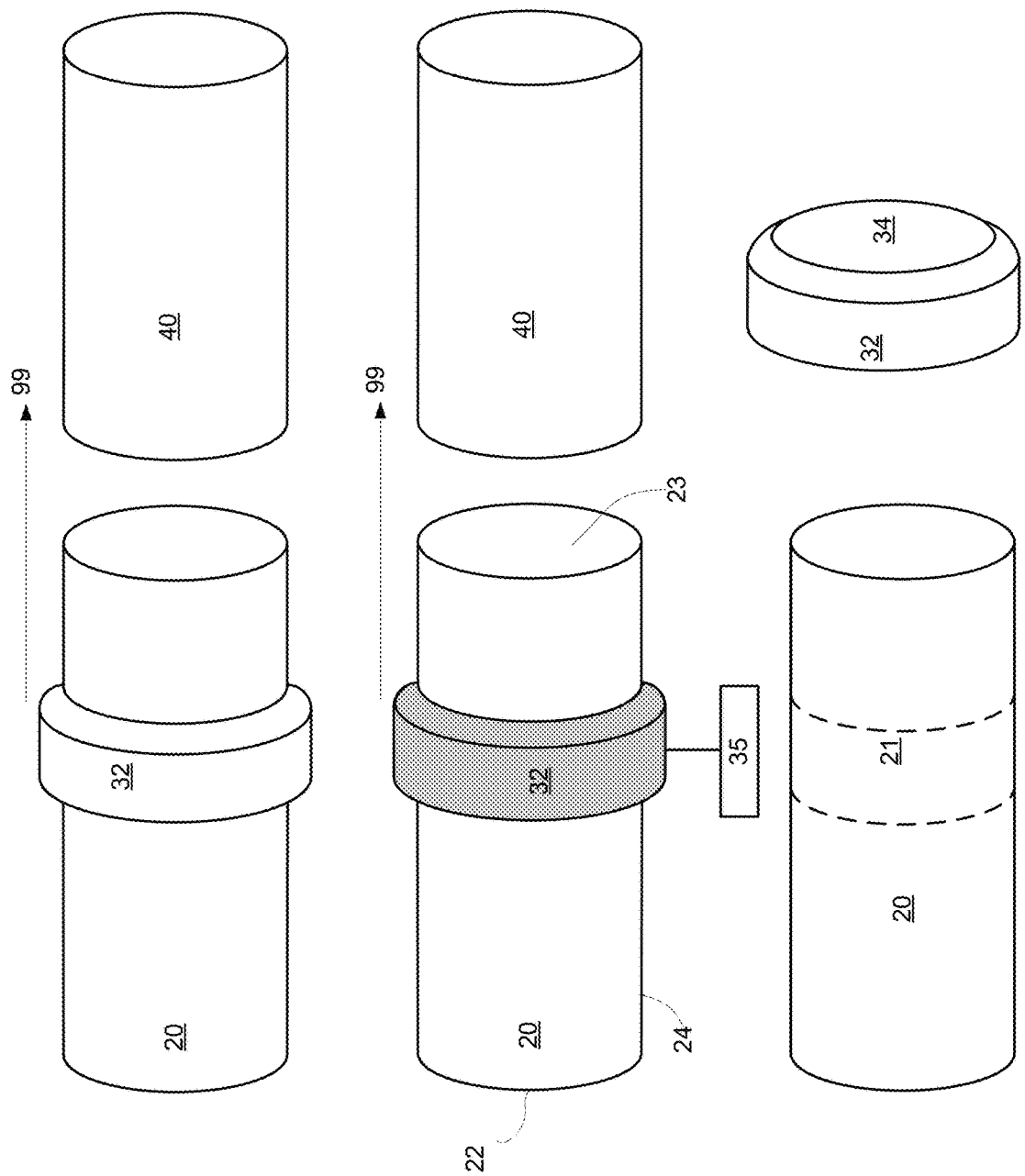
FIG. 2 is an example of an adjustable attenuation optical unit and its environment.

In FIGS. 2-3 the adjustable attenuator 32 is chamber that is fluidly coupled to fluid control unit 35. The chamber has an interior portion 34 that interfaces with the area 21 and the fluid control unit 35 is configured to control a flow of fluid having a refraction index that exceeds the refraction index of air into the chamber. The fluid may be gas or liquid or both gas and liquid.

FIG. 3 illustrates the propagation of light 91 in the lightguide 20. Light 92 and light 93 exit the lightguide and enter the adjustable attenuator 32. Light 93 does not return to the lightguide. Light 92 is further attenuated within chamber 32 and returns to the lightguide 20.

Figure 4:
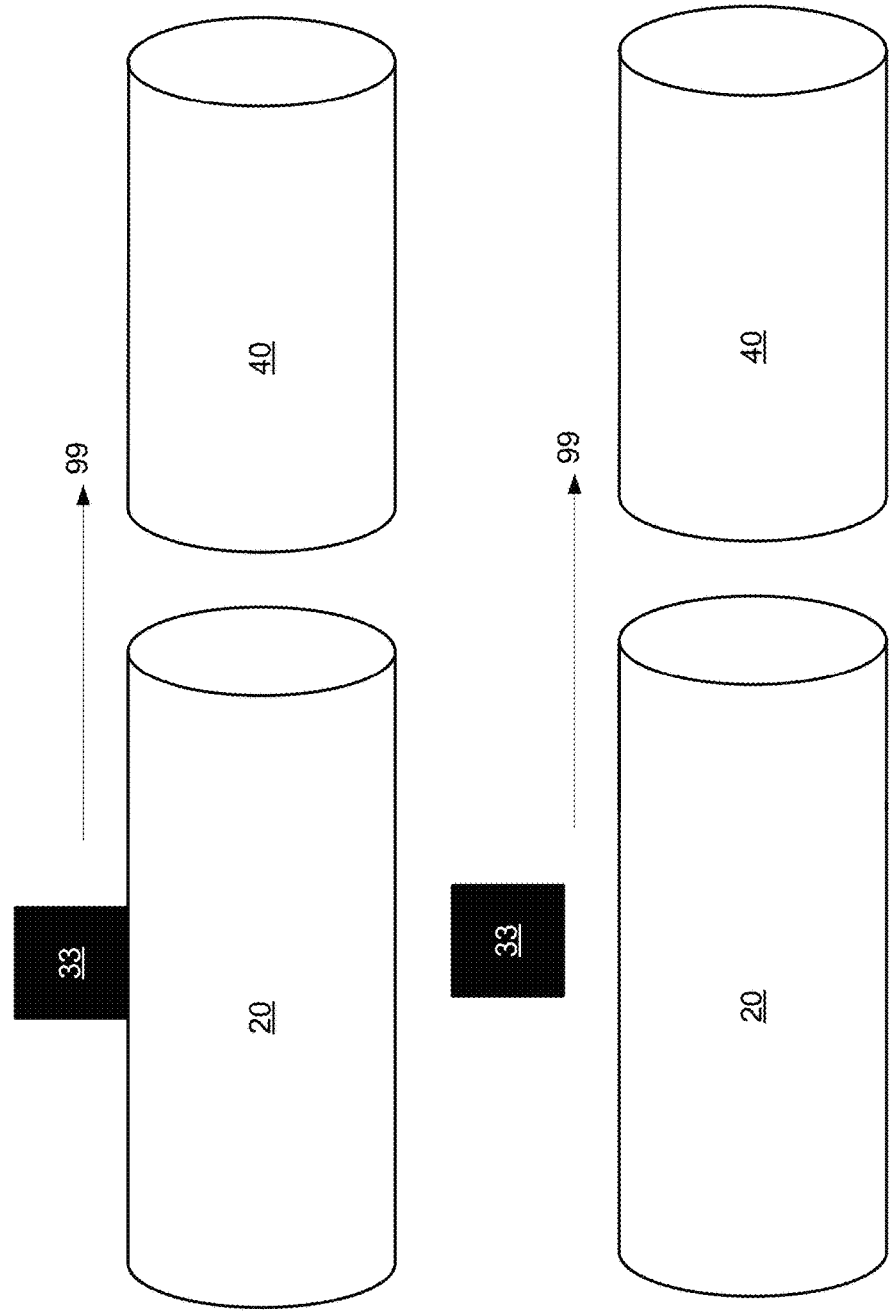
FIG. 4 is an example of an adjustable attenuation optical unit and its environment.

In FIG. 4-5 the adjustable attenuator is a light absorbing element 33 or other light receiving element that is configured to selectively contact the area. The light absorbing element 33 may move in relation to the lightguide, for example between (a) a first position in which the light receiving element contacts the area, and (b) a second position in which the light receiving element is spaced apart from the area.

FIG. 5 illustrates the propagation of light 91 in the lightguide 20. Light 92 and light 93 exit the lightguide, enter the light absorbing element adjustable attenuator 32 and to not return to the lightguide.

Figure 6:
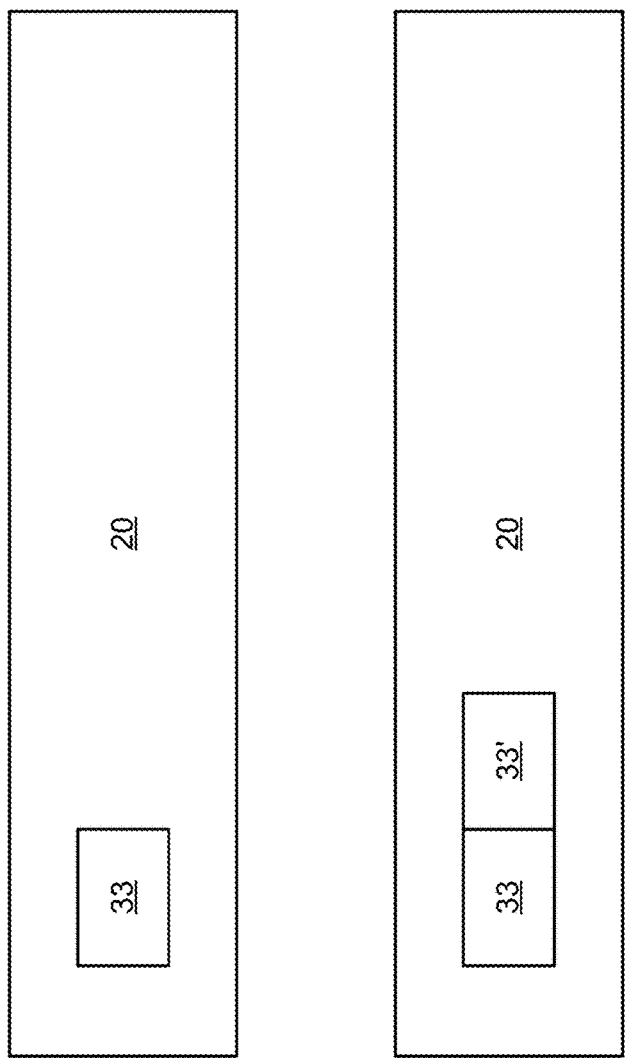
FIG. 6 is an example of an adjustable attenuation optical unit and a core.

FIG. 6 illustrates that the light absorbing element may contact one area 33 of the lightguide or two areas (33 and 33') of the lightguide or any other number (not shown) of areas of the lightguide.

The area of the lightguide that interfaces with any of the mentioned above adjustable attenuators may be of any shape and size. The adjustable attenuator may contact any number of areas of any shape and size.

Figure 7:
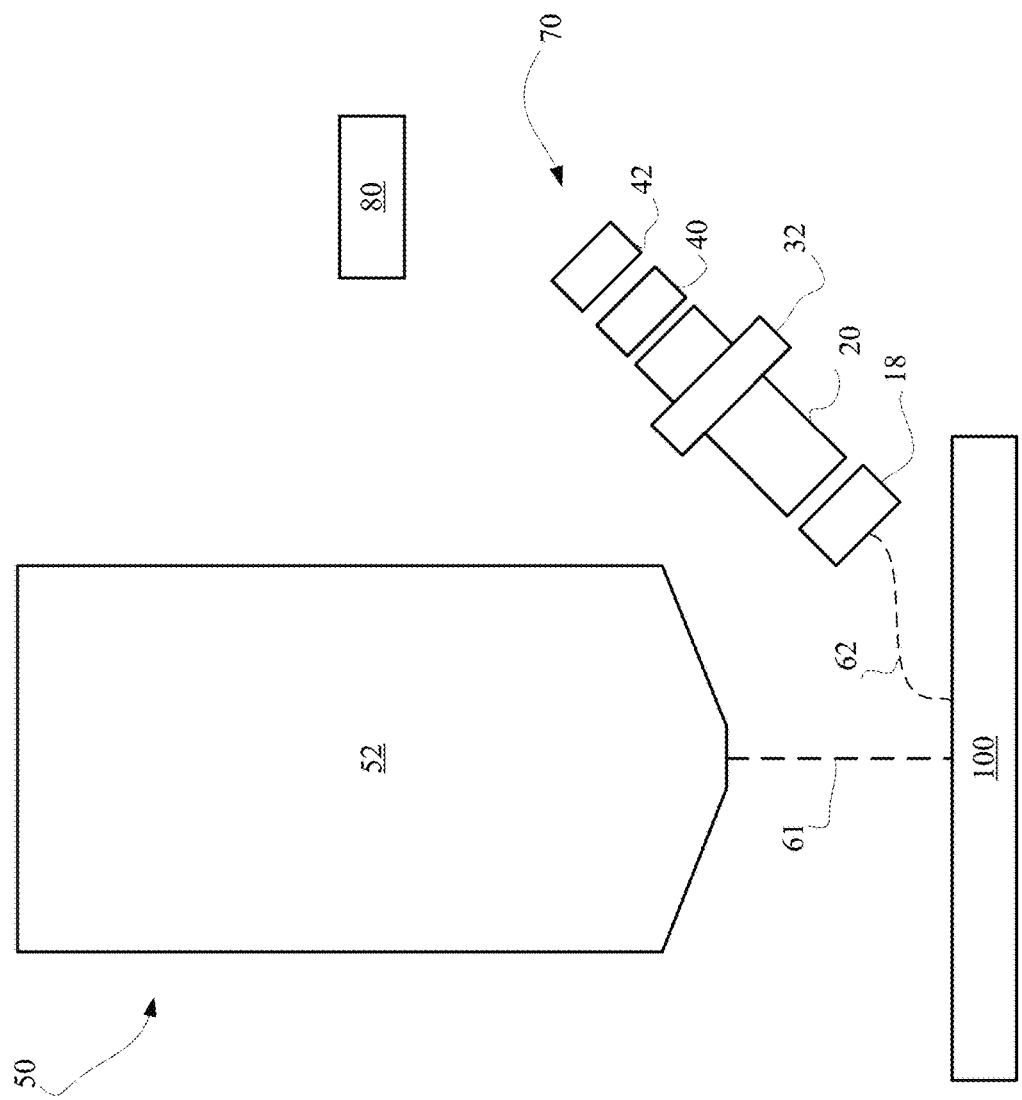
FIG. 7 is an example of a SEM.

FIG. 7 illustrates SEM 50 and a sample 100. SEM column 52 illuminates sample 100 with an illuminating electron beam 61, scattered or reflected electrons 62 enter collection path 70 in which the scattered or reflected electrons 62 impinge on electron to light converter 18, light from the light converter enters lightguide 20 and may be selectively attenuated by an attenuation unit such as chamber 32, and then propagate to PMT 40 and converted to digital signals by converter 42.

Processor 80 may process the digital signals and/or control the SEM in any manner.

Higher maximal T % values are expected when using the chamber and the movable light absorbing element (higher in relation to the electrochromic glass and the LC or SPD glass). The LC or SPD glass is expected to have the lowest transition time and the lowest minimal T % value.

Figure 8:
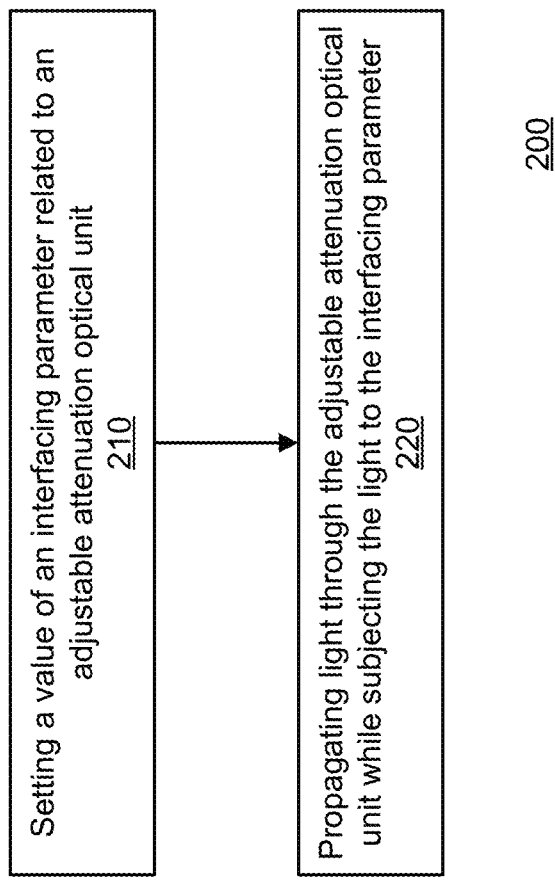
FIG. 8 is an example of a method.

FIG. 8 illustrates an example of method 200 for setting an adjustable attenuation optical unit.

Method 200 may start by step 210 of setting a value of an interfacing parameter related to an adjustable attenuation optical unit. The adjustable attenuation optical unit may include a lightguide and an adjustable attenuator. The lightguide has a core that may have an input, an output and an exterior surface. The adjustable attenuator may be configured to define an interfacing parameter related to an area of the exterior surface thereby receiving at least some of the light that impinges on the area.

Step 210 may be followed by step 220 of propagating light through the adjustable attenuation optical unit while subjecting the light to the interfacing parameter.

Step 210 may include setting the value of the interfacing parameter based on a throughput of an evaluation of a sample. The evaluation of the sample may include illuminating the sample with an electron beam, collecting emitted electrons that were reflected or scattered from the sample, and converting the emitted electrons to the light that propagates through the adjustable attenuation optical unit.

Step 210 may include determining the transmission of the adjustable attenuation optical unit to exceed a transmission threshold, wherein the transmission threshold may be a function of an intensity of the electron beam, an electron yield, a collection parameter indicative of an amount of collected emitted electrons, sample bias, electron energy impact on the detector, electron LE.

For example: $T\% = (Ip \times \text{Yield}(\text{sample}, LE, \text{signal type}) \times \text{Collection})) / \text{Predefined\_Value}$.

Whereas:
Yield(sample, LE, signal type)—means that the yield is a function of the material of the sample (material at an illuminated point of the sample).
Landing energy (LE) and signal type—type of detected particle—for example secondary electron, backscattered electron or ion.
Collection—ratio (intensity or energy) between emitted signal and detected signal.

If according to the equation T % is smaller than a transmission threshold, a T % may be selected that will not be lower than the transmission threshold in order to avoid detection efficiency drops.

The adjustable attenuator may be a light absorbing element and the method may include selectively contacting the area by the light absorbing element.

The adjustable attenuator may be a light conduit the method may include selectively contacting the area by the light conduit.

The adjustable attenuator may be a light receiving element and the method may include moving the light receiving element between (a) a first position in which the light receiving element contacts the area, and (b) a second position in which the light receiving element may be spaced apart from the area.

The adjustable attenuator may be a light receiving element and the method may include moving the light receiving element between (a) a first position in which the light receiving element contacts the area, and (b) a second position in which the light receiving element may be spaced apart from the area, and (c) a third position in which the light receiving element contacts the area and another area of the exterior surface.

The adjustable attenuator may include a chamber and a fluid control unit, wherein the chamber has an interior portion that interfaces with the area and the method may include controlling, by the fluid control unit, a flow of fluid having a refraction index that exceeds the refraction index of air into the chamber.

The method and system may be configured to synchronize AC type devices (LC glass, SPD glass) with the SEM scan so that no modulation occurs within a given frame. The modulation frequency of the device will be set such that a transition only occurred after acquiring an integer number of SEM frames.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. An adjustable attenuation optical unit, comprising:
a lightguide having an input, an output and an exterior surface extending between the input and output that surrounds a core, wherein the light guide is configured such that light received at the input propagates through the core of the lightguide and exits from the output;
a photomultiplier tube operatively coupled to receive light that propagates through the lightguide; and
an adjustable attenuator coupled between the input of the lightguide and the photomultiplier tube and configured to reduce an intensity of light that propagates through the lightguide prior to the light reaching the photomultiplier tube.

2. The adjustable attenuation optical unit according to claim 1 wherein the adjustable attenuator comprises liquid crystal (LC) glass.

3. The adjustable attenuation optical unit according to claim 1 wherein the adjustable attenuator comprises suspected particle device (SPD) glass, SPD smart glass, electrochromic glass, thermochromic glass or photochromatic glass.

4. The adjustable attenuation optical unit according to claim 1 wherein the area is annular.

5. The adjustable attenuation optical unit according to claim 1 wherein the area is located outside an optical path between the input and the photomultiplier tube.

6. A method of attenuating an intensity of light that impinges upon a photomultiplier tube operatively coupled to detect electrons scattered or reflected from a sample illuminated by a charged particle column of scanning electron microscope, the method comprising:
receiving light generated by the scattered or reflected electrons at an input of a light guide;
propagating the light through a core of the lightguide;
reducing an intensity of the light with an adjustable attenuation optical unit prior to the light reaching the photomultiplier tube.

7. The method according to claim 6 further comprising:
wherein the evaluation of the sample comprises:
illuminating the sample with an electron beam;
collecting emitted electrons that were reflected or scattered from the sample, and
converting the emitted electrons to the light that is received at the input of the light guide.

8. The method according to claim 6 wherein reducing an intensity of the light with an adjustable attenuator comprises passing the light through liquid crystal glass.

9. An adjustable attenuation optical unit, comprising:
a lightguide having an input, an output and an exterior surface extending between the input and output that surrounds a core, wherein the light guide is configured such that light received at the input propagates through the core of the lightguide and exits from the output; and
an adjustable attenuator coupled to and disposed inline with the output of the lightguide, the adjustable attenuator configured to receive light from the lightguide and reduce an intensity of the received light by adjusting one or more of the transparency of the adjustable attenuator or an aperture of the adjustable attenuator.

10. The adjustable attenuation optical unit set forth in claim 9 wherein the adjustable attenuator comprises liquid crystal (LC) glass.

11. The adjustable attenuation optical unit set forth in claim 9 wherein the adjustable attenuator comprises suspected particle device (SPD) glass, SPD smart glass, electrochromic glass, thermochromic glass or a photochromatic glass.

12. The adjustable attenuation optical unit set forth in claim 9 wherein the adjustable attenuator comprises a blocking portion and an adjustable aperture formed through the blocking portion.

13. The adjustable attenuation optical unit set forth in claim 9 further comprising a photomultiplier tube, wherein the adjustable attenuator is disposed between the output of the lightguide and an input of the photomultiplier tube.

* * * * *